(12) United States Patent
Wojcieszak et al.

(10) Patent No.: US 6,718,452 B1
(45) Date of Patent: Apr. 6, 2004

(54) STORAGE ARRAY SUPPORTING A PLURALITY OF INSTRUCTION MODES

(75) Inventors: Laurent Wojcieszak, Meylan (FR); Sonia Ferrante, Grenoble (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/563,610

(22) Filed: May 2, 2000

(30) Foreign Application Priority Data

May 3, 1999 (EP) .............................................. 99410050

(51) Int. Cl.[7] .......................... G06F 12/00; G06F 13/00
(52) U.S. Cl. ........................ 711/171; 711/170; 712/210; 712/43
(58) Field of Search .............................. 711/171, 170, 711/172; 712/14, 24, 43, 210, 207

(56) References Cited

U.S. PATENT DOCUMENTS

| | | | | |
|---|---|---|---|---|
| 4,751,671 A | * | 6/1988 | Babetski et al. | 710/56 |
| 4,817,051 A | | 3/1989 | Chang | 365/154 |
| 4,847,759 A | * | 7/1989 | Oklobdzija | 710/53 |
| 5,134,711 A | * | 7/1992 | Asthana et al. | 712/7 |
| 5,726,584 A | * | 3/1998 | Freidin | 326/38 |
| 5,925,122 A | * | 7/1999 | Ohsawa | 712/210 |
| 6,049,863 A | * | 4/2000 | Tran et al. | 712/213 |
| 6,175,524 B1 | * | 1/2001 | Kwak | 365/189.05 |
| 6,288,969 B1 | * | 9/2001 | Gibbins et al. | 365/230.05 |
| 6,442,646 B1 | * | 8/2002 | Tsuruta | 711/109 |

FOREIGN PATENT DOCUMENTS

WO WO 92/08230 5/1992

OTHER PUBLICATIONS

European Search Report from European application No. 99410050, filed May 3, 3000.

* cited by examiner

*Primary Examiner*—Kimberly McLean-Mayo
(74) *Attorney, Agent, or Firm*—Lisa K. Jorgenson; James H. Morris; Wolf, Greenfield & Sacks, P.C.

(57) ABSTRACT

A storage array is described which is specifically adapted to support a specific set of instruction modes of a processor. A first set of storage cells have a write input and a single read output. Second and third sets of storage cells each have a write input and only two read outputs. A fourth set of storage cells each have a write input and only three outputs. All the write inputs are addressable in common by a single write address and the read outputs are individually selectable responsive to a read pointer.

7 Claims, 4 Drawing Sheets

Figure 1:
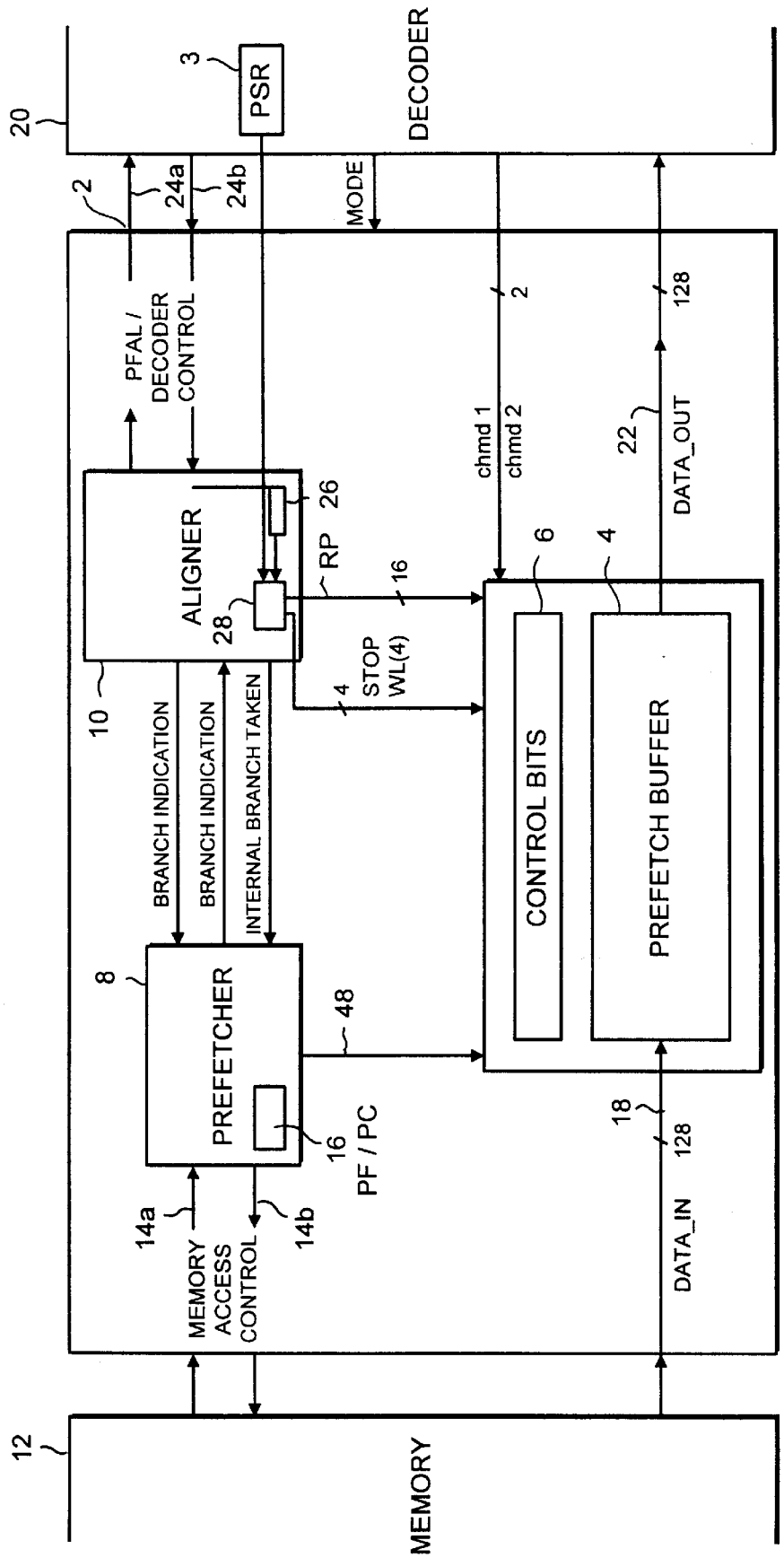

STORAGE ARRAY SUPPORTING A PLURALITY OF INSTRUCTION MODES

FIELD OF THE INVENTION

The present invention relates to a storage array for use in a computer system.

BACKGROUND OF THE INVENTION

In a computer system, instructions are typically fetched from a program memory, decoded and supplied to an execution unit where they are executed to run the program stored in the program memory. According to a novel design of computer system developed by the applicants, a number of different instruction modes are supported. To support these modes, data is held in a storage array which allows data to be written a line of 8n bits at a time, but to be read selectively in sequences of 2n bits. Thus, according to the described embodiment there is an input data port for writing of 128 bits and four output data ports for reading, each of 32 bits. Thus, lines of 128 bits in length are written one at a time, while it is possible to read different numbers of 32 bit sequences depending on the instruction mode of the machine.

According to a first instruction mode, one sequence of 2n-bits is read out during each machine cycle to supply a pair of n-bit instructions to a decode unit (referred to herein as GP16 mode).

According to a second instruction mode, two sequences of 2n-bits are read during each machine cycle to provide two 2n-bit instructions to the decode unit (referred to herein as GP32 mode).

According to a third instruction mode, four sequences of 2n-bits are read out during each machine cycle to provide simultaneously four instructions each of 2n-bits to the decode unit (referred to herein as VLIW (Very Long Instruction Word) mode). It is a function of VLIW mode that these four instructions constitute the line held in the storage array.

The present inventors have developed a storage array which supports these instruction modes in a simplified fashion.

SUMMARY OF THE INVENTION

According to the present invention there is provided a storage array for holding instructions in a processor comprising:

- a first set of storage cells each having a write input and a single read output;
- second and third sets of storage cells each having a write input and only two read outputs; and
- a fourth set of storage cells each having a write input and only three outputs,
- wherein all the write inputs are addressable in common by a single write address and wherein the read outputs are individually selectable responsive to a read pointer.

In the described embodiment, the storage array comprises four output ports, wherein the first output port is connected to receive data from any of the first to fourth sets, the second output port is connected to receive data only from the second or fourth set, and the third and fourth output ports are connected to receive data respectively only from the third and fourth sets.

The storage array can include read circuitry for reading instructions out of the storage array in dependence on the instruction mode of the processor. Thus, according to the first instruction mode the read circuitry reads out successively from the first to third sets during successive machine cycles to supply a pair of instructions to the first output port during each machine cycle.

In the second instruction mode, the read circuitry reads out from the first and second sets during a first machine cycle and the third and fourth sets during a next machine cycle to provide two instructions respectively to the first and second output ports during each machine cycle.

According to the third instruction mode, the read circuitry read out all four sets during each machine cycle to provide the four VLIW instructions respectively to the first to fourth ports.

By carefully arranging the configuration of the storage array as defined above to support the three instruction modes, it has been possible to significantly reduce the routing congestion of hard-wires, because all sets of storage cells do not need to be connected to every output port. That is, it removes the requirement for each memory cell to have four read ports, which would normally be the case if the memory cell was for connection to four output ports. Reducing the number of read ports for each cell makes routing easier and saves silicon area.

In addition, the read circuitry can be simplified and can be provided by a number of reduced input multiplexor gates as outlined in the following description.

For a better understanding of the present invention and to show how the same may be carried into effect, reference will now be made by way of example to the accompanying drawings.

BRIEF DESCRIPTION OF THE DRAWINGS

FIG. 1 is a block diagram of a prefetch unit;

FIG. 2 illustrates the different instruction modes of the processor;

FIG. 3 illustrates the organisation of a prefetch buffer;

FIG. 4 is a schematic diagram illustrating the operation of the prefetch buffer;

FIG. 5 is a simplified sketch showing communication paths for an instruction line in storage; and FIGS. 6*a* to 6*c* represent different types of memory cells to implement the communication paths.

DESCRIPTION OF THE PREFERRED EMBODIMENTS

FIG. 1 is a block diagram of a prefetch unit 2 for a processor, the prefetch unit 2 comprising a prefetch buffer 4 with associated control bits 6 and control circuitry comprising a prefetcher 8 and an aligner 10. The prefetcher 8 is connected to a program memory 12 and is responsible for initiating memory accesses to the program memory 12 using memory access control signals 14*a*, 14*b*. The address in memory to which a fetch is initiated is held in a prefetch program counter 16 in the prefetcher 8. Control of the prefetch program counter is not discussed herein, but it can be assumed that fetches are initiated from memory in accordance with a sequence of instructions to be executed by the processor. That is, the prefetch program counter may be incremented each time as a sequence of adjacent instructions is fetched, or it may change according to branches, traps, interrupts etc. Responsive to a memory fetch initiated by the prefetcher, instruction words are supplied from the program memory 12 to the prefetch buffer 4 as represented by data-in path 18.

The aligner 10 controls reading of instructions from the prefetch buffer to a decoder 20 along data-out path 22. To do this, the aligner issues and is responsive to prefetcher align (PFAL)/decoder control signals 24a, 24b. The aligner 10 has an align program counter 26 which keeps track of how many instructions have been dispatched to the decoder 20 in each machine cycle, and a state machine 28 which generates a read pointer RP for controlling the prefetch buffer in a manner which is described in more detail hereinafter.

Figure 2:
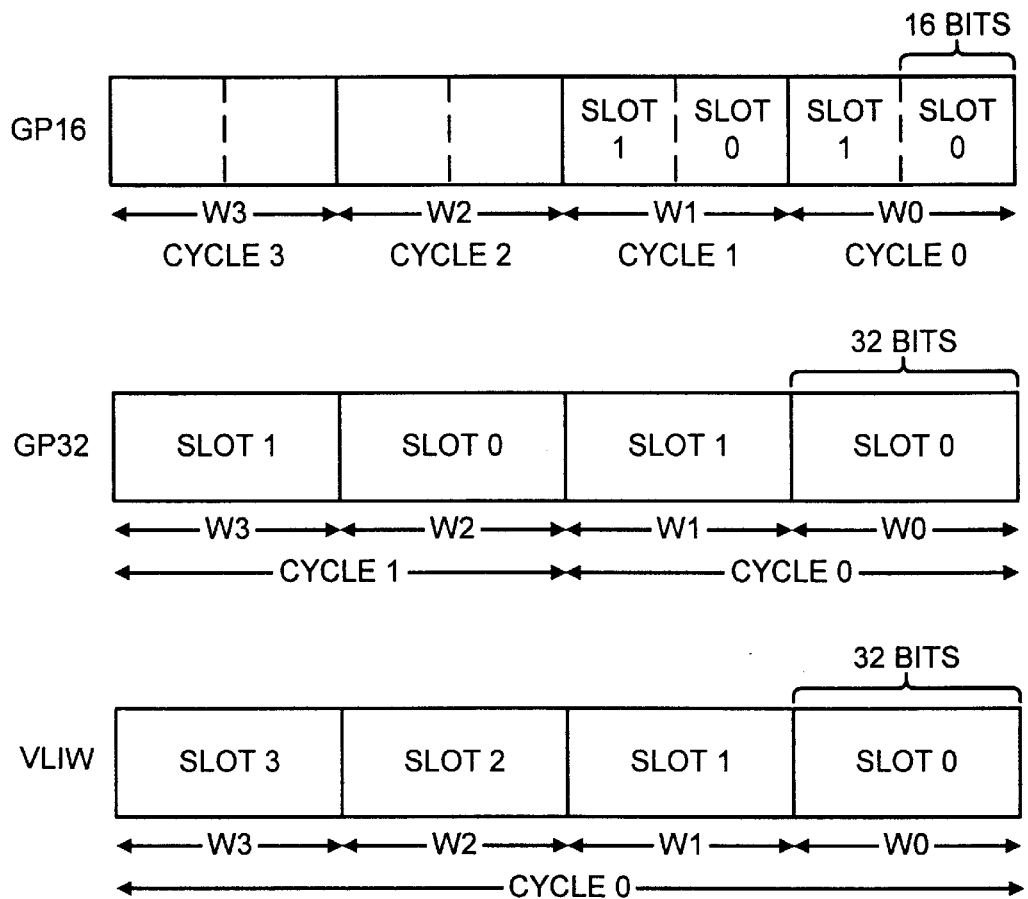

Instructions in the program memory 12 can have a length of 16 bits or 32 bits. The prefetch buffer supports three different instruction modes as described with reference to FIG. 2 as follows. The instruction mode is held in a process status register (PSR) 3 and can be changed. Change mode signals chmd1,chmd2 are issued by the decoder 20 responsive to a change in instruction mode.

According to a first instruction mode, a pair of 16 bit instructions are supplied during each machine cycle to the decoder 20 from the prefetch buffer 4. This pair is denoted slot0,slot1 in bit sequences w0,w1 etc. This is referred to herein as GP16 mode.

According to a second instruction mode, two instructions each having a length of 32 bits are supplied to the decoder from the prefetch buffer in each machine cycle, for example w0,w1 in CYCLE 0. This mode is referred to herein as GP32 mode.

According to a third instruction mode, four instructions w0,w1,w2,w3 each of 32 bits in length are supplied to the decoder in each machine cycle. This is referred to herein as VLIW.

In all modes, each fetch operation initiated to the program memory 12 retrieves an instruction word of 128 bits in length. Thus, in GP16 mode, the instruction word comprises eight 16 bit instructions, paired as slot0,slot1 for each machine cycle. In GP32 and VLIW mode, the instruction word comprises four 32 bit instructions.

Figure 3:
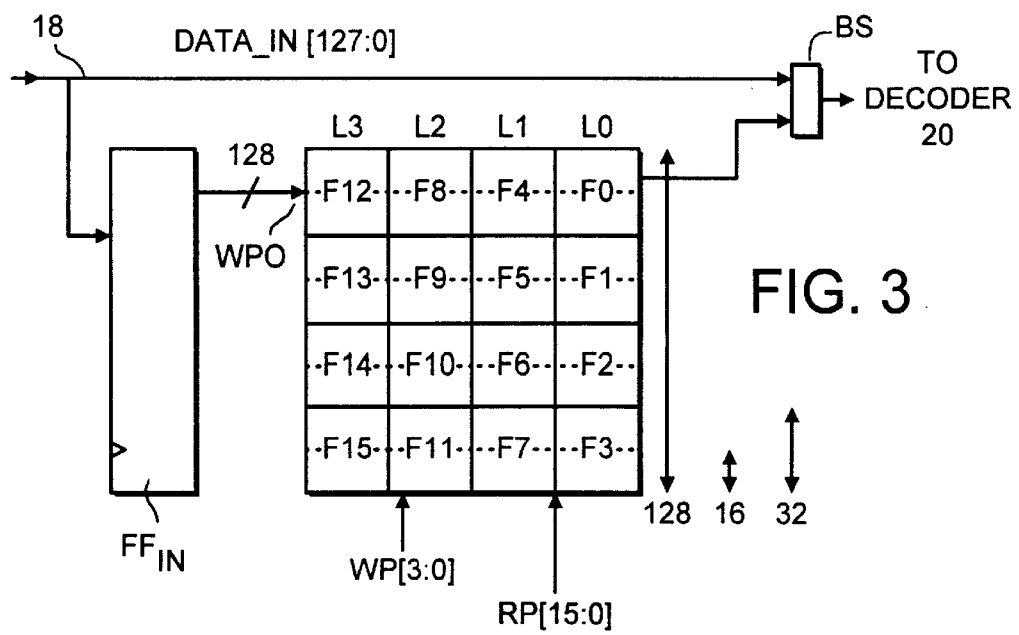

The organisation of the prefetch buffer 4 is illustrated in FIG. 3. In diagrammatic terms, the prefetch buffer can be considered to have four successive lines L0 to L3, each having a capacity of 128 bits. There is a single write port WP0 having a width of 128 bits which receives data from the program memory via the data-in path 18 and an input latch FF-in and writes it into the selected line under the control of a write pointer WP [3:0 ]. Each line comprises four storage locations each having a capacity of 32 bits and each of which is shown diagrammatically divided into two 16 bit sections for the purposes of explanation. The storage locations are denoted F0 to F15. Each line in FIG. 3 is referred to herein as a group of storage locations and has the capacity for one 128 bit line from memory. This allows up to four successive memory accesses to be made, even if the first instruction word has not been received or executed by the processor. While the instruction word in storage locations F0 to F3 is being decoded and subsequently executed, memory fetches can continue to be implemented into the storage locations F4 to F7, F8 to F11 and F12 to F15 until the buffer is full. By the time that a memory fetch has been made into the last group F12 to F15, it is most likely that the first group F0 to F3 will have been completely read out into the decoder and will thus be ready to receive a subsequent instruction word from memory. The number of cycles required to decode an instruction word in each group varies depending on the instruction mode of the machine in a manner which will be described in more detail in the following. Nevertheless, a minimum of one cycle is required for reading and decoding, and therefore the use of the prefetch buffer hides memory latency.

In order to save a cycle when the prefetch buffer is empty or flushed after a branch, data can bypass the prefetch buffer through a bypass circuitry BS. As described in more detail later, the bypass circuitry is implemented as a plurality of multiplexors (MUX0 to MUX3 in FIG. 4).

Figure 4:
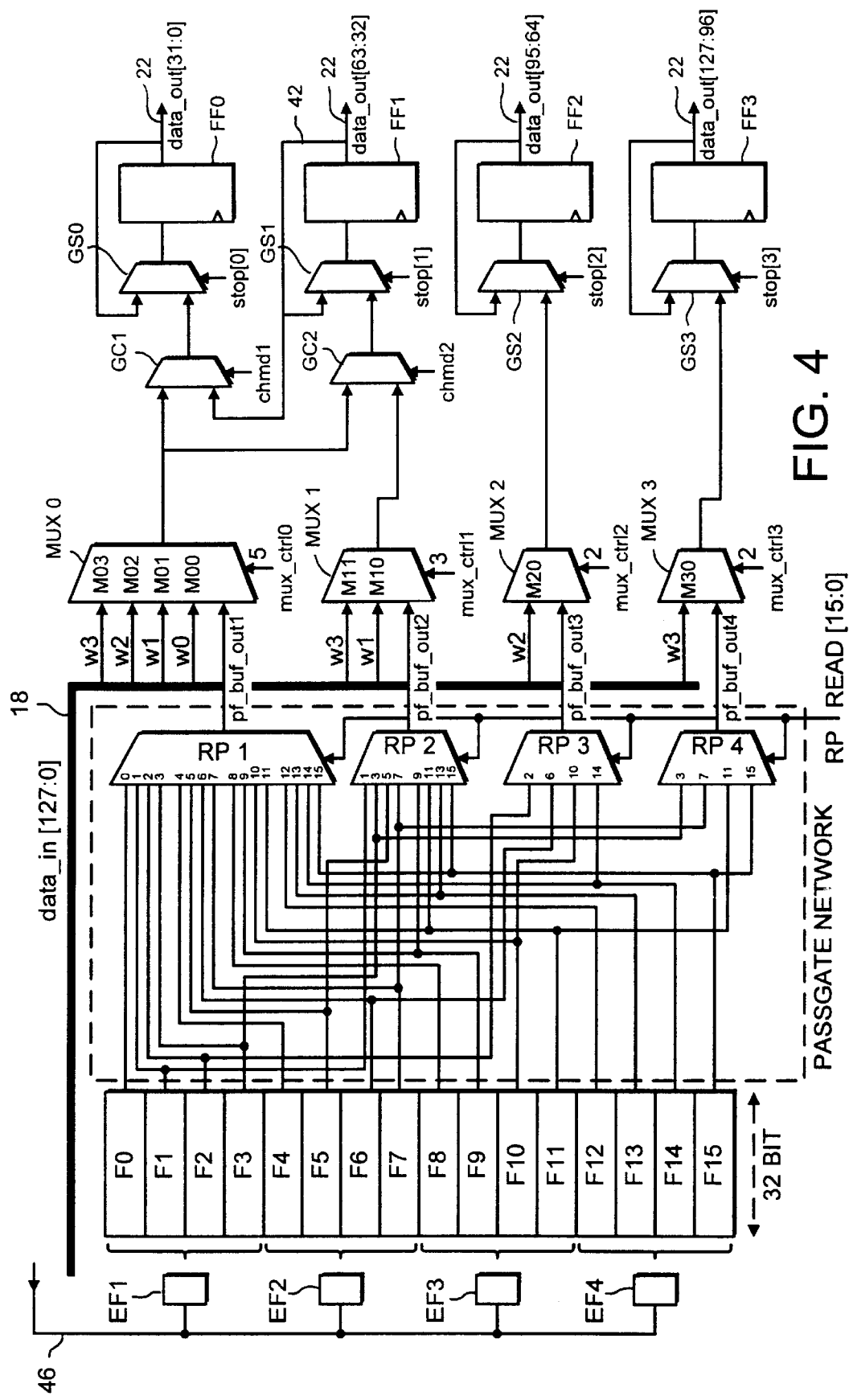

FIG. 4 is a more detailed diagram of the prefetch buffer and its associated read circuitry. The storage locations F0 to F15 are illustrated aligned vertically for the purposes of explanation.

The control bits 6 described above in FIG. 1 include empty flags EF1 to EF4 which indicate when a complete 128 bit line of storage locations is empty such that a subsequent memory fetch can be initiated. When a fetch is instituted from memory, and data has been received by the prefetch buffer, the empty flag is cleared to indicate that those storage locations are now full.

Reading from the prefetch buffer will now be described with reference to the schematic diagram of FIG. 4. The prefetch buffer includes four read ports RP1,RP2,RP3 and RP4. These read ports each take the form of multiplexors each capable of connecting selected ones of the storage locations F0 to F15 to a 32 bit output, pf-buf-out1,2,3 or 4. However, the read ports are not identical. The first read port RP1 has sixteen inputs each of which is connected to a respective storage location F0 to F15 and each of which can be connected to the output pf-buf-out1. The second read port RP2 has eight inputs which are respectively connected to storage locations F1,F3,F5,F7,F9,F11,F13,F15 to selectively connect the contents of those storage locations to the output pf-buf-out2.

The third read port RP3 has four inputs connected to storage locations F2,F6,F10 and F14 for selectively connecting the contents of those storage locations to the output pf-buf-out3. The fourth read port RP4 also has four inputs which are connected to storage locations F3,F7,F11 and F15 for selectively connecting the contents of those storage locations to the output pf-buf-out4.

The read ports RP1 to RP4 are controlled by the read pointer RP from the aligner 10 in dependence on the instruction mode of the machine and the consequential number of machine cycles required for decoding each instruction word.

Alternatively, for instructions supplied directly from memory along data-in path 18, the control of instructions supplied to the decoder in dependence on the instruction mode and machine cycles is additionally controllable by multiplexors MUX0,MUX1,MUX2 and MUX3. These receive at their input respective bits of the 128 bit data-in path 18 to supply a 32 bit sequence to each multiplexor in each machine cycle as described in the following.

The selection of which instructions within the instruction word are supplied to the decoder 20 is made on dependence on the instruction mode as described in the following. In FIG. 3, the symbols w0 to w3 are used on different input lines of the multiplexors MUX0 to MUX3 to represent different 32 bit sequences, as in FIG. 4. The definition of each 32 bit sequence depends on the instruction mode, but bits of the data-in path are always allocated as w0 [0:31], w1 [32:63], w2 [64:95], w3 [96:127 ]. The inputs to the multiplexors are individually labelled so as to distinguish between them. That is, in GP16 mode, on the first decode cycle, cycle 0, the first sequence w0 is supplied to the decoder 20. This presents a pair of 16 bit instructions, slot0,slot1 (w0) for simultaneous decoding by the decoder 20. On the next cycle, cycle 1, the sequence w1 is supplied, presenting the next pair of 16 bit instructions slot0,slot1 (w1) for decoding. In GP16 mode, the read port RP1 and the multiplexor MUX0 are the only read devices which are used and the control of the word which is supplied to the decoder is made by the multiplexor MUX0 under the control of signal mux-ctrl0, and the read pointer RP. If the signal mux-ctrl0 selects the read port output pf-buf-out1, the read pointer selects inputs F0 to F3 over four successive cycles CYCLE0 to CYCLE3 to read out successively w0 to w4. Once storage location F3 has been read out, the read port counter will reset the read port RP1 so that it reads out from storage locations F4 to F7 over the next four cycles. If the buffer is not in use, the first instruction pair w0 is read out by the multiplexor MUX0. That is in cycle 0, input M00 of the multiplexor MUX0 is selected. Meanwhile, the 128 bit line is loaded into the first location of the prefetch buffer and the read pointer points to the next location to be read out by the decoder. Therefore on cycle 1, the next instruction pair w1 is read out by the multiplexor MUX0 by selecting pf-buf-out1.

In GP32 mode, in the first machine cycle the first two instructions w0,w1 are presented to the decoder 20. In the subsequent cycle, cycle 1, the next two instructions w2, w3 are presented to the decoder. This utilises read ports RP1 and RP2 and the multiplexors MUX0 and MUX1. If the signal mux-ctrl0 is set to pf-buf-out1, and mux-ctrl1 to pf-buf-out2, then the read pointer RP is set to F0 for RP1 and F1 for RP2 in cycle 0. In cycle 1, it is changed to F2 and F3 respectively. Instructions are then read over the next two cycles from the next group of storage locations F4 to F7 by altering the setting of the read ports RP1 and RP2 responsive to the read pointer RP. Alternatively, when read from the data-in path 18, in the first cycle, the first input M10 of the multiplexor MUX1 is set to read w1 (bits 31 to 63) and the first input M00 of the multiplexor MUX0 is set to read w0 (bits 0 to 31). Thus, instructions w0 and w1 are presented to the decoder 20 in CYCLE 0. Meanwhile, the 128 bit line is loaded into the prefetch buffer so that in the subsequent cycle, CYCLE 1, w2 and w3 are read from the buffer by selecting pf-buf-out1 and pf-buf-out2.

In VLIW mode, four 32 bit instructions W0 to W3 (slot0 to slot3) are supplied simultaneously to the decoder 20 in each machine cycle, e.g. CYCLE 0. The multiplexors MUX2 and MUX3 are set according to the control signals mux-ctrl2 and mux-ctrl3 respectively to allow the instruction words w2 and w3 to be read either from the buffer or from the data-in path 18. In other respects, the settings of RP1 and RP2, MUX0 and MUX1 are as in GP32 mode. However, in the subsequent cycle, e.g. CYCLE 1 in VLIW mode, it will be noticed that the instruction words w2 and w3 which would have been remaining in GP32 mode have now been read out. Therefore, the read pointer RP can immediately move on to the next set of storage locations F4 to F7 to read out the subsequent VLIW instruction word containing the next four instructions.

Data is passed from the multiplexors MUX0 to MUX3 to respective output flip-flops FF0 to FF3 via a set of control gates labelled GC1, GC2 and GS0 to GS3. The control gates GC1, GC2 are responsive to change mode signals chmd1, chmd2 respectively which indicate to the prefetch unit that there has been a change in the instruction mode in which the machine is operating. The control gates GS0 to GS3 are responsive to respective stop signals stop[0] to stop[3] to prevent any new data from entering the decoder from that output flip-flop. These effectively allow the decoder to be stalled. In a stop condition, the outputs of the flip-flops are recirculated to the input of its associated control switch to prevent unnecessary operation of the subsequent decoder.

Operation of the prefetch unit responsive to the change mode signals chmd1 and chmd2 will now be described. The output flip-flop FF0 is connected to a single 32 bit decoder and to two 16 bit decoders. When the machine is in GP16 mode, the outputs of the two 16 bit decoders are selected for the instruction pair supplied to the flip-flop FF0. When the machine is in GP32 mode, the output of the 32 bit decoder is selected. The remaining flip-flops FF1 to FF3 are each connected to respective 32 bit decoders.

A first change mode signal chmd1 signals a change of machine instruction mode from GP32 to GP16. If the machine had been operating in GP32 mode, consider the situation at the end of cycle 0 which reference to FIG. 2. Instructions w0 and w1 will have been supplied via the flip-flops FF0 and FF1 to the respective 32 bit decoders of the decoder 20. However, the change in instruction mode now implies that the 32 bit sequence which was formerly to be considered as the second instruction W1 in cycle 0 of GP32 mode, in fact contains a pair of 16 bit instructions as denoted in cycle 1 of GP16 mode. Thus, the output of the 32 bit decoder connected to the flip-flop FF1 needs to be ignored, and the 32 bit sequence w1 needs to be reapplied to the two 16 bit decoders connected to the output flip-flop F0. This is achieved by the recirculation line 42 from the output of the flip-flop FF1 to the input of the control gate CG1.

Conversely, control signal chmd2 denotes a change of instruction mode from GP16 to GP32. Consider again the effect at the end of cycle 0 with reference to FIG. 2. The instruction pair denoted w0 has just been decoded in GP16 mode, and the expectation is that the machine will now wait for the next instruction pair w1. However, in GP32 mode, that word w1 represents a single instruction and the change mode signal chmd2 allows it to be applied directly through the control gate GC2 to the output flip-flop FF1 so that it can be applied directly to the input of the dedicated 32 bit decoder connected to the output of the flip-flop FF1. This allows the instruction w1 to be decoded as a single 32 bit instruction. In the next cycle, instructions w2 and w3 can be transmitted normally as indicated by cycle 1 in GP32 mode in FIG. 2.

It will be clear from the above that the number of cycles needed to read all four storage locations in a group depends on the instruction mode. That is, in GP16 mode, four cycles are needed, in GP32 two cycles are needed and VLIW one cycle is needed. When all the storage locations F0 to F3 in the first group have been read, the first empty flag EF1 is cleared to empty.

The aligner controls the setting and clearing of the "empty" flags using information from the read pointer. The aligner detects when the read pointer goes from one line (128 bits) to the next. When this occurs, the "empty" flag corresponding to the page which has just been read is set.

The state of an empty flag being cleared is detected by the prefetcher 8 along line 48 and a fetch is initiated to the next prefetch address in the prefetch program counter 16. Thus, the next instruction line, is fetched from memory and the write pointer WP is set to write it into storage locations F0 to F3. In the meantime, the read pointer has moved to the second group F4 to F7 to read and decode instructions of that group. When those storage locations are empty, the empty flag EF2 is cleared, a next memory fetch is initiated by the prefetcher 8 and the read pointer moves onto the group F8 to F11. As can readily be seen, the prefetch buffers masks a latency of memory fetches of at least three cycles in the VLIW mode, and a greater number of cycles in GP32 and GP16 mode. Signals are supplied from the decoder along line 24b to the aligner 10 indicating what mode the decoder is operating in so that the aligner can adjust the align program counter 26 accordingly and keep track of the next instructions to be decoded so that the read pointer RP can correctly be issued by the state machine 28.

Figure 5:
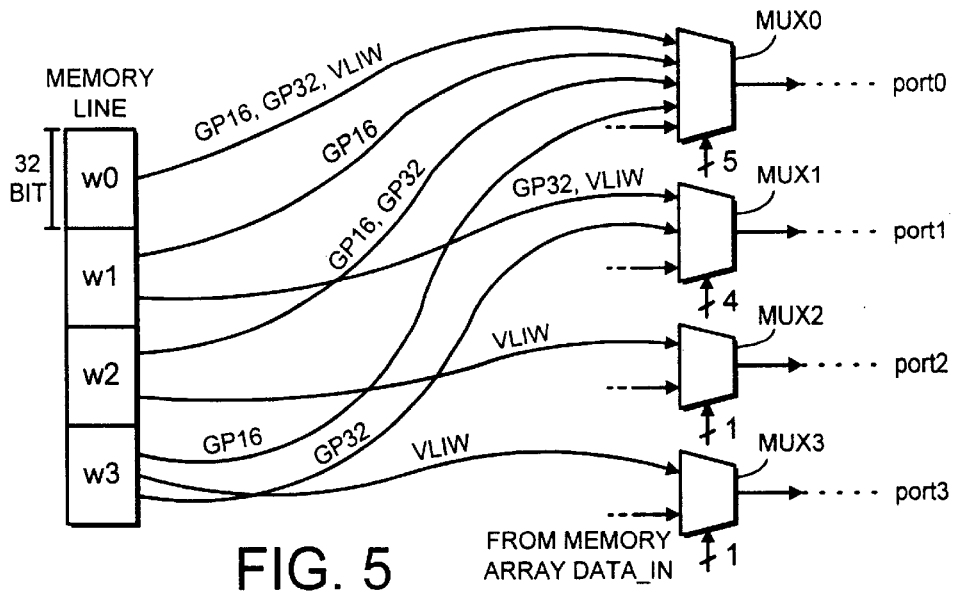

For the purposes of describing an optimised implementation of the prefetch buffer, reference is now made to FIG. 5. FIG. 5 is a greatly simplified schematic version which illustrates for each bit sequence w0 to w3 in a memory line of 128 bits the required connections through the multiplexors MUX0 to MUX4 to the output devices FF0 to FF4. In FIG. 5, note that the output devices are referred to as port0 to port3. FIG. 5 can best be understood in conjunction with FIG. 2. That is, in GP16 mode, it may be necessary to connect any of the 32 bit sequences w0 to w3 via the first multiplexor MUX0 to port0. In GP32 mode, there may be a need to connect bit sequences w0,w2 to the first multiplexor MUX0, and bit sequences w1,w3 to the second multiplexor MUX1. In VLIW mode, each bit sequence w0 to w3 can be routed directly to its associated multiplexor MUX0 to MUX3. Moreover, there is never a requirement to direct the bit sequence w0 to any multiplexor other than MUX0.

TABLE 1

| page word | instruction mode | | |
|---|---|---|---|
| | GP16 | GP32 | VLIW |
| word0 | port0 | port0 | port0 |
| word1 | port0 | port1 | port1 |
| word2 | port0 | port0 | port2 |
| word3 | port0 | port1 | port3 |

To summarise FIG. 5, Table I illustrates how the four bit sequences of each memory line are connected to the output ports depending on the instruction mode of the machine. By noticing these features, the inventors have realised that it is possible to significantly simplify implementation of the memory cells in the buffer storage locations F0 to F15 in dependence on the bit sequence within the memory line that the buffer storage locations are intended to hold. It is apparent from FIG. 3, that the first bit sequence w0 will be held in buffer storage locations F0,F4,F8 or F12. Bit sequence w1 will be held in storage locations F1,F5,F9 or F13. Bit sequence w2 will be held in storage locations F2,F6,F10 or F14. Bit sequence w3 will be held in storage locations F3,F7,F11 or F15.

Figure 6A:
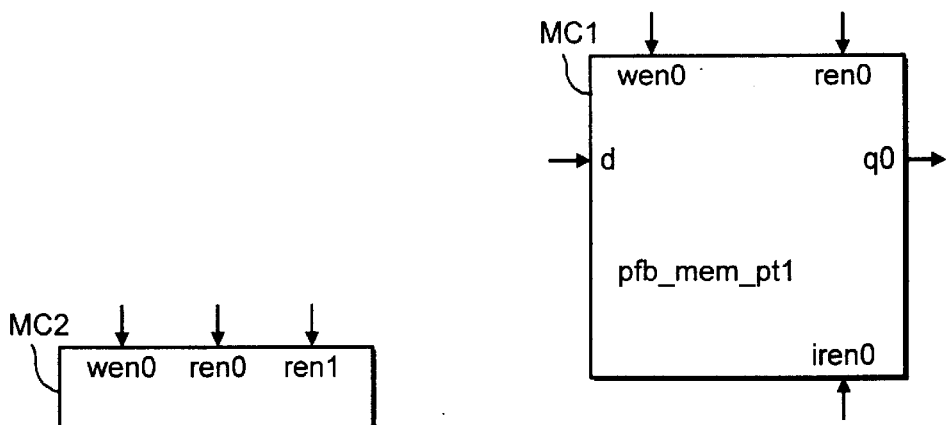

FIG. 6a illustrates a memory cell MC1 suitable for storage of the first bit sequence w0. It has a single write port d responsive to a write enable signal wen0, and a single read port q0 responsive to a read enable signal ren0, and a read pointer input iren0. The storage locations F0,F4,F8 and F12 comprise 32 such cells for supplying the 32 bit word to the first multiplexor MUX0.

Figure 6B:
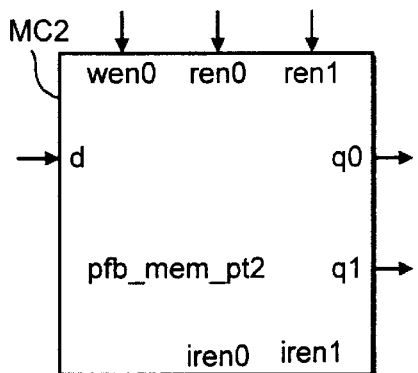

FIG. 6b illustrates the configuration of a memory cell MC2 which could be used for the storage locations F1,F2, F5,F6,F9,F10,F13 and F14. The memory cell has a single write input d operative responsive to a write enable signal wen0. The memory cell MC2 has two read outputs q0,q1, each supplying an output responsive to read enable signals ren0,ren1 and read pointer selections at inputs iren0,iren1. Such a memory cell used in the storage location allows the bit sequences w1,w2 to be written selectively to MUX0, MUX1 (in the case of w1) and MUX0,MUX2 (in the case of w2).

Figure 6C:
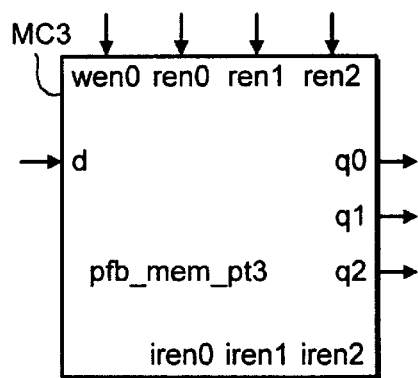

Finally, FIG. 6c illustrates a memory cell MC3 suitable for F3,F7,F11 and F15. That memory cell MC3 has a single write input d responsive to a write enable signal wen0. It has three read outputs q0,q1 and q2, each having an output responsive to read enable signals ren0,ren1,ren2 and read pointer selections at inputs iren0,iren1,iren2. By use of this storage memory cell, the bit sequence w3 can selectively be connected to MUX0,MUX1 and MUX3 responsive to the required read pointer selection.

With the above implementation, only eight read ports per page in memory are required instead of sixteen. This means a smaller memory array and reduces routing complexity. Moreover, the multiplexors MUX0 to MUX3 can be simplified in that it is possible to use, instead of four 5 to 1 multiplexors, one 5 to 1 multiplexor, MUX0, one 3 to 1 multiplexor, MUX1, and two 2 to 1 multiplexors, MUX2, MUX3. Thus, this reduces the amount of silicon which is needed to implement the circuit and the routing complexity.

What is claimed is:

1. A storage array for holding instructions in a processor comprising:

a first set of storage cells each having a write input and a single read output;

second and third sets of storage cells each having a write input and only two read outputs; and a fourth set of storage cells each having a write input and only three outputs;

wherein all the write inputs are addressable in common by a single write address and wherein the read outputs are individually selectable responsive to a read pointer; and four output ports, wherein the first output port is connected to receive data from any of the first to forth sets, the second output port is connected to receive data only from the second or fourth set, and the third and fourth output ports are connected to receive data respectively only from the third and fourth sets.

2. A storage array according to claim 1, further comprising read circuitry for reading instructions out of the storage array according to an instruction mode of the processor, said instruction mode controlling the sets which are read during a machine cycle and wherein the read circuitry is responsive to a first instruction mode to read out successively from the first to third sets during successive machine cycles to supply a pair of instructions to the first output port during each machine cycle.

3. A storage array according to claim 1, further comprising read circuitry for reading instructions out of the storage array according to an instruction mode of the processor, said instruction mode controlling the sets which are read during a machine cycle and wherein the read circuitry is responsive to a second instruction mode to read out from the first and second sets during a first machine cycle and the third and fourth sets during a next machine cycle to provide two instructions respectively to the first and second output ports during each machine cycle.

4. A storage array according to claim 1, further comprising read circuitry for reading instructions out of the storage array according to an instruction mode of the processor, said instruction mode controlling the sets which are read during a machine cycle and wherein the read circuitry is responsive to a third instruction mode to read out all four sets during each machine cycle to provide four instructions respectively to the first to fourth ports.

5. The storage array according to claim 1, wherein the storage array is a prefetch buffer.

6. The storage array according to claim 1, wherein the storage array is a program memory.

7. A storage array according to claim 1, further comprising read circuitry for reading instructions out of the storage array according to an instruction mode of the processor, said instruction mode controlling the sets which are read during a machine cycle.

* * * * *